(12) United States Patent
Maung et al.

(10) Patent No.: US 11,386,036 B2
(45) Date of Patent: Jul. 12, 2022

(54) EMBEDDED UNIVERSAL SERIAL BUS 2 REPEATER

(71) Applicant: TEXAS INSTRUMENTS INCORPORATED, Dallas, TX (US)

(72) Inventors: Win Naing Maung, Plano, TX (US); Saurabh Goyal, Bangalore (IN); Bhupendra Sharma, Bangalore (IN); Huanzhang Huang, Plano, TX (US); Douglas Edward Wente, Murphy, TX (US); Suzanne Mary Vining, Plano, TX (US); Mustafa Ulvi Erdogan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 192 days.

(21) Appl. No.: 16/404,461

(22) Filed: May 6, 2019

(65) Prior Publication Data

US 2020/0042488 A1 Feb. 6, 2020

Related U.S. Application Data

(60) Provisional application No. 62/714,913, filed on Aug. 6, 2018.

(51) Int. Cl.
*G06F 13/42* (2006.01)
*G06F 13/38* (2006.01)
*H04L 12/46* (2006.01)
*H03F 3/45* (2006.01)
*H04B 3/58* (2006.01)

(52) U.S. Cl.
CPC ........ *G06F 13/4291* (2013.01); *G06F 13/385* (2013.01); *H03F 3/45179* (2013.01); *H04B 3/58* (2013.01); *H04L 12/46* (2013.01); *G06F 2213/0042* (2013.01)

(58) Field of Classification Search
CPC .................................................. G06F 13/4077
See application file for complete search history.

(56) References Cited

U.S. PATENT DOCUMENTS 7,250,792 B2 * 7/2007 Swartz ................ G06F 13/4077
326/115
7,400,173 B1 7/2008 Kwong et al.
7,443,211 B2 10/2008 Liu
8,223,567 B2 * 7/2012 Abu Rahma ............ G11C 7/12
365/203

(Continued)

OTHER PUBLICATIONS

International Search Report in corresponding PCT Application No. PCT/US2019/047877, dated Nov. 21, 2019 (2 pages).

(Continued)

*Primary Examiner* — Henry Tsai
*Assistant Examiner* — Juanito Borromeo
(74) *Attorney, Agent, or Firm* — John R. Pessetto; Charles A. Brill; Frank D. Cimino

(57) ABSTRACT

At least some aspects of the present disclosure provide for a method. In some examples, the method includes receiving, at a circuit, data via a differential input signal, detecting a rising edge in the data received via the differential input signal, and precharging a common mode voltage (Vcm) node of the differential input signal responsive to detecting the rising edge in the data received via the differential input signal, wherein the Vcm node is a floating node.

9 Claims, 4 Drawing Sheets

(56) References Cited

U.S. PATENT DOCUMENTS

| | | | |
|---|---|---|---|
| 8,332,563 | B2 | 12/2012 | Sobelman |
| 9,130,817 | B2 | 9/2015 | Yang |
| 10,333,473 | B1* | 6/2019 | Shen .................. H03F 3/45475 |
| 10,657,089 | B2 | 5/2020 | Maung et al. |
| 10,657,090 | B2 | 5/2020 | Maung et al. |
| 11,010,319 | B2 | 5/2021 | Maung et al. |
| 2007/0173216 | A1 | 7/2007 | Blum |
| 2007/0201104 | A1 | 8/2007 | Kihara |
| 2010/0329391 | A1* | 12/2010 | Fukuda .................. H03G 3/342 375/319 |
| 2010/0332695 | A1 | 12/2010 | Fukuda et al. |
| 2011/0063010 | A1 | 3/2011 | Namkoong |
| 2013/0029622 | A1 | 1/2013 | Zhan |
| 2014/0003473 | A1 | 1/2014 | Chen et al. |
| 2015/0227489 | A1 | 8/2015 | Chen et al. |
| 2016/0162427 | A1 | 6/2016 | Kang et al. |
| 2016/0162430 | A1 | 6/2016 | Ma et al. |
| 2016/0380747 | A1 | 12/2016 | Low et al. |
| 2017/0277249 | A1 | 9/2017 | Low et al. |
| 2018/0173666 | A1 | 6/2018 | Srivastava |
| 2019/0288743 | A1 | 9/2019 | Wang et al. |

OTHER PUBLICATIONS

International Search Report in corresponding PCT Application No. PCT/US2019/043334, dated Feb. 27, 2020 (2 pages).

Compaq Computer Corporation et al., "Universal Serial Bus Specification," Revision 2.0, Apr. 27, 2000, 650 p., in 9 parts. [Online: https://www.usb.org/document-library/usb-20-specification].

Compaq Computer Corporation, "USB 2.0 Adopters Agreement," Apr. 14, 2011, 6 p. [Online: https://www.usb.org/document-library/usb-20-specification].

Compaq Comupter Corporation et al., "Errata for 'USB Revision 2.0 Apr. 27, 2000' as of Dec. 7, 2000," 31 p. [Online: https://www.usb.org/document-library/usb-20-specification].

Compaq Comuter Corporation et al., "USB 2.0 Specification Engineering Change Notice (ECN) #1: Mini-B Connector," Oct. 20, 2000,45 p. [Online: https://www.usb.org/document-library/usb-20-specification].

Compaq Computer Corporation et al., "Pull-Up/Pull-Down Resistors," USB Engineering Change Notice, 5 p. [Online: https://www.usb.org/document-library/usb-20-specification].

Compaq Computer Corporation et al., "Errata for 'USB Revision 2.0 Apr. 27, 2000' as of May 28, 2002," 7 p. [Online: https://www.usb.org/document-library/usb-20-specification].

Compaq Computer Corporation et al., "Interface Association Descriptors," USB Engineering Change Notice, 5 p. [Online: https://www.usb.org/document-library/usb-20-specification].

Compaq Computer Corporation et al., "Rounded Chamfer," Engineering Change Notice, Oct. 8, 2003, 3 p. [Online: https://www.usb.org/document-library/usb-20-specification].

Compaq Computer Corporation et al., "Unicode UTF-16LE for String Descriptors," USB Engineering Change Notice, Feb. 21, 2005, 2 p. [Online: https://www.usb.org/document-library/usb-20-specification].

Compaq Computer Corporation et al., "Inter-Chip USB Supplement to the USB 2.0 Specification," Revision 1.0, Mar. 13, 2006, 48 p. [Online: https://www.usb.org/document-library/usb-20-specification].

Compaq Computer Corporation et al., "Device Class Specification Adopters Agreement," Apr. 4, 2007, 5 p. [Online: https://www.usb.org/document-library/usb-20-specification].

Compaq Computer Corportion et al., "USB 2.0 Link Power Management Addendum," Engineering Change Notice, Jul. 16, 2007, 29 p. [Online: https://www.usb.org/document-library/usb-20-specification].

Compaq Computer Corporation et al., "High- Speed Inter-Chip USB Electrical Specification," Version 1.0, Sep. 23, 2007,16 p. [Online: https://www.usb.org/document-library/usb-20-specification].

Compaq Computer Corporation et al., "Suspend Current Limit Changes," USB Engineering Change Notice, Apr. 9, 2008,2 p. [Online: https://www.usb.org/document-library/usb-20-specification].

Compaq Computer Corporation et al., "5V Short Circuit Withstand Requirement Change," USB Engineering Change Notice, Dec. 22, 2008, 2 p. [Online: https://www.usb.org/document-library/usb-20-specification].

Compaq Computer Corporation et al., "Device Capacitance," USB Engineering Change Notice, Dec. 22, 2008, 2 p. [Online: https://www.usb.org/document-library/usb-20-specification].

Compaq Computer Corporation et al., "Material Change," USB Engineering Change Notice, Dec. 22, 2008, 3 p. [Online: https://www.usb.org/document-library/usb-20-specification].

Compaq Computer Corporation et al., "USB 2.0 Phase-Locked SOFs," USB Engineering Change Notice, Dec. 22, 2008, 2 p. [Online: https://www.usb.org/document-library/usb-20-specification].

Compaq Computer Corporation et al., "USB 2.0 DC Resistance," USB Engineering Change Notice, Dec. 22, 2008, 8 p. [Online: https://www.usb.org/document-library/usb-20-specification].

Compaq Computer Corporation et al., An Examination of the Effect of Power to Signal & of Signal to Power (Supplement for XV-4687C), Dec. 2, 2009, 15 p. [Online: https://www.usb.org/document-library/usb-20-specification].

Compaq Computer Corporation et al., "Clarification on the Chamfer on USB 2.0 Micro Connectors," USB Engineering Change Notice, Mar. 23, 2010, 4 p. [Online: https://www.usb.org/document-library/usb-20-specification].

Compaq Computer Corporation et al., "Maximum Un-Mating Force Value Definition to Micro Connector USB 2.0," Mar. 23, 2010, 3 p. [Online: https://www.usb.org/document-library/usb-20-specification].

Compaq Computer Corporation et al., "'On-The-Go Supplement to the USB 2.0 Specification' Adopters Agreement," May 26, 2009, 1 p. [Online: https://www.usb.org/document-library/usb-20-specification].

Compaq Computer Corporation et al., "USB Test Mode Selector Values," USB Engineering Change Notice, Jul. 26, 2010, 3 p. [Online: https://www.usb.org/document-library/usb-20-specification].

Compaq Computer Corporation et al., "Errata for USB 2.0 ECN: Link Power Management (LPM)—Jul. 2007," Sep. 28, 2011, 8 p. [Online: https://www.usb.org/document-library/usb-20-specification].

Compaq Computer Corporation et al., "On-The-Go and Embedded Host Supplement to the USB Revision 2.0 Specification," Revision 2.0 version 1.1a, Jul. 27, 2012, 96 p., in 2 parts. [Online: https://www.usb.org/document-library/usb-20-specification].

Compaq Computer Corporation et al., "HSIC ECN," USB Engineering Change Notice, May 21, 2012, 6 p. [Online: https://www.usb.org/document-library/usb-20-specification].

Compaq Computer Corporation et al., USB 2.0 Connect Timing Update, USB Engineering Change Notice, Apr. 4, 2013, 6 p. [Online: https://www.usb.org/document-library/usb-20-specification].

Compaq Computer Corporation et al., "Disconnect Supplement to High Speed Inter Chip Specification," Revision 1.0, Sep. 18, 2013, 8 p. [Online: https://www.usb.org/document-library/usb-20-specification].

Compaq Computer Corporation et al., "USB 2.0 VBUS Max Limit," Aug. 11, 2014, 5 p. [Online: https://www.usb.org/document-library/usb-20-specification].

Compaq Computer Corporation et al., "Maximum Vbus Voltage," Nov. 26, 2014, 4 p. [Online: https://www.usb.org/document-library/usb-20-specification].

"Quad Type Cable Additional for Micro USB," 3 p.

"MicroUSB Micro-B ID Pin Resistance and Tolerance Stack-Up between D+ and D–," USB Engineering Change Notice, 2 p.

Compaq Computer Corporation et al., Universal Serial Bus Micro-USB Cables and Connectors Specification, Revision 1.01, Apr. 4, 2007, 36 p.

Fujikura Ltd., "ECN Proposal for Micro-USB Cables," Aug. 15, 2008, 23 p.

Compaq Computer Corporation et al., "On-The-Go and Embedded Host Supplement to the USB Revision 2.0 Specification," Revision 2.0, version 1.1a, Jul. 27, 2012, 96 p., in 2 parts.

Apple Inc. et al., "Embedded USB2 (eUSB2) Physical Layer Supplement to the USB Revision 2.0 Specification," Revision 1.1, Copyright 2018 Apple Inc. et al., 164 p., in 2 parts.

International Search Report in corresponding PCT Application No. PCT/US2019/045326, dated Oct. 24, 2019 (2 pages).

(56) References Cited

OTHER PUBLICATIONS

Supplementary European Search Report in corresponding European Patent Application No. EP19855353, dated Aug. 20, 2021 (3 pages).

* cited by examiner

EMBEDDED UNIVERSAL SERIAL BUS 2 REPEATER

CROSS-REFERENCE TO RELATED APPLICATIONS

The present application claims priority to U.S. Provisional Patent Application No. 62/714,913, which was filed Aug. 6, 2018, is titled "eUSB2—USB 2.0 REPEATER THAT CAN SUPPORT USB HS START OF PACKET (SOP) WITH JITTER SETTLING WITHIN THE FIRST 4 UIS OF THE SOP WITHOUT USING CDR OR PLL FOR BOTH INGRESS AND EGRESS DIRECTIONS AS WELL AS THE ABILITY TO AVOID FIRST PARTIAL BIT," and is hereby incorporated herein by reference in its entirety.

SUMMARY

At least some aspects of the present disclosure provide for a circuit. In some examples, the circuit includes a first amplifier, a second amplifier, a third amplifier, a squelch detector, a first resistor, a second resistor, a first capacitor, a first transistor, and a logic circuit. The first amplifier has a first input coupled to a first node, a second input coupled to a second node, a first output, and a second output. The second amplifier has a first input coupled to the first output of the first amplifier, a second input coupled to the second output of the first amplifier, a first output, and a second output. The third amplifier has a first input coupled to the first output of the second amplifier, a second input coupled to the second output of the second amplifier, a first output coupled to a third node, and a second output coupled to a fourth node. The squelch detector has a first input coupled to the first node, a second input coupled to the second node, and an output. The first resistor is coupled between the first node and a fifth node. The second resistor is coupled between the fifth node and the second node. The first capacitor is coupled between the fifth node and a ground terminal. The first transistor has a source terminal coupled to the fifth node, a drain terminal coupled to a sixth node, and a gate terminal. The sixth node is configured to receive a bias voltage signal. The logic circuit has an input coupled to the output of the squelch detector and an output coupled to the gate terminal of the first transistor.

Other aspects of the present disclosure provide for a circuit. In some examples, the circuit includes a squelch detector, a first resistor, a second resistor, a first capacitor, a first transistor, a second capacitor, a second transistor, and a logic circuit. The squelch detector has a first input coupled to a first node, a second input coupled to a second node, and an output. The first node is configured to receive a positive component of a differential input signal with a floating center tap. The second node is configured to receive a negative component of the differential input signal with the floating center tap. The first resistor is coupled between the first node and a third node. The second resistor is coupled between the third node and the second node. The first capacitor is coupled between the third node and a ground terminal. The first transistor has a source terminal coupled to the third node, a drain terminal coupled to a fourth node, and a gate terminal. The second capacitor is coupled between the fourth node and the ground terminal. The second transistor has a source terminal coupled to the sixth node, a drain terminal configured to receive a bias voltage signal, and a gate terminal. The logic circuit has an input coupled to the output of the squelch detector, a first output coupled to the gate terminal of the first transistor, and a second output coupled to the gate terminal of the second transistor.

Other aspects of the present disclosure provide for a method. In some examples, the method includes receiving, at a circuit, data via a differential input signal, detecting a rising edge in the data received via the differential input signal, and precharging a common mode voltage (Vcm) node of the differential input signal responsive to detecting the rising edge in the data received via the differential input signal, wherein the Vcm node is a floating node.

BRIEF DESCRIPTION OF THE DRAWINGS

For a detailed description of various examples, reference will now be made to the accompanying drawings in which.

DETAILED DESCRIPTION

Figure 1:
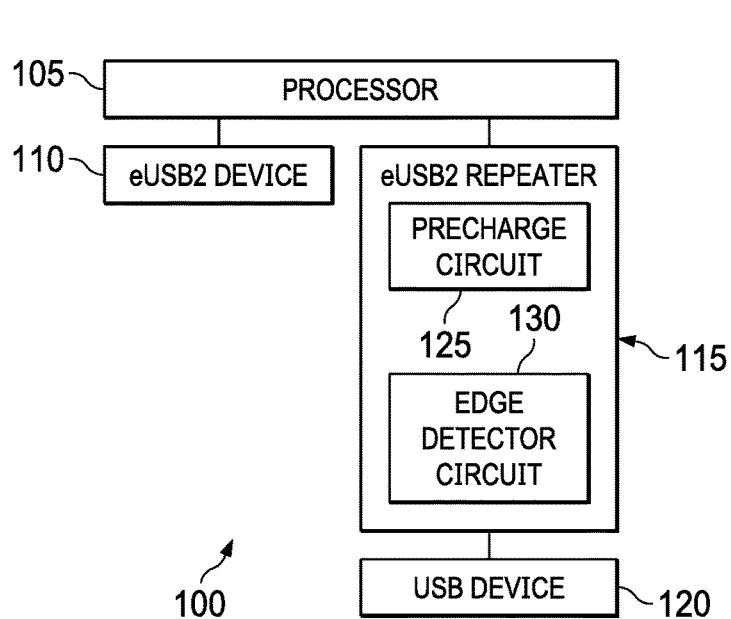
FIG. 1 shows a block diagram of an illustrative system in accordance with various examples.

Universal Serial Bus (USB) is a standard establishing specifications for interconnect cabling, connectors, and communication protocols. As referred to herein, USB refers to any version of the USB specification, including any amendments or supplements, certified by the USB Implementers Forum (USB IF) or any suitable body who replaces and/or aids the USB IF in its role overseeing the USB specification, whether now existing or later developed. In at least one example, USB, as referred to herein, encompasses any one or more of the USB 1.0 specification, USB 2.0 specification, USB 3.0 specification, USB 4.0 specification, or any derivatives thereof, such as amended or ".x" variations of the above specifications. Also, as referred to herein, legacy USB refers to USB 2.x and/or USB 1.x. Embedded USB (eUSB), in at least some examples, refers to eUSB2. While reference is made herein to eUSB2, in various examples the teachings of the present disclosure are further applicable to other versions of eUSB2 that are extensions of, alternatives to, derivatives of, or otherwise share at least some commonalities with, or similarities to, eUSB2. Accordingly, while eUSB2 is referred to herein in an exemplary manner, the present disclosure is, in some examples, not limited to implementation in an eUSB2 environment, in an eUSB2 environment, or in a USB environment.

At its inception, USB was primarily intended for implementation in specifying standards for connection and communication between personal computers and peripheral devices. However, as adoption of the USB standard has expanded and implementation in computing devices of support for the USB standard has gained in popularity, efforts have been made to extend and expand the applicability of USB. For example, while initially establishing specifications for communications between personal computers and peripheral devices, USB has expanded to communication between peripheral devices, between personal computers, and other use cases. As a result of such widespread implementation and use of USB, efforts are being further made to utilize USB as a communication protocol among individual subsystems or circuits (e.g., such as a system-on-a-chip (SoC)). Such implementations are sometimes referred to as eUSB2. New challenges arise in implementing eUSB2. For example, at a circuit level, computing devices often operate at voltage levels that vary from those of conventional USB, creating an impediment between direct communication between eUSB2 and legacy USB systems. To mitigate this impediment, an eUSB2 repeater operates as a bridge or non-linear redriver between eUSB2 and legacy USB systems, or vice versa, to translate between legacy USB signaling voltage levels that are customarily about 3.3 volts (V) and eUSB2 signaling voltages levels that are circuit-level (e.g., silicon appropriate voltages) such as about 1.0 V, 1.2 V, 1.4 V, or any other suitable value less than 3.3 V.

In legacy USB systems, a center tap of differential signal lines is referenced to ground. However, in eUSB2 systems, the center tap of differential signal lines is floating, having a capacitance of up to about 50 picofarads (pF) present at the center tap. As a result of this capacitance, when communication begins in an eUSB2 system, such as when the eUSB2 differential signal lines go from an idle state to an active state in which data is communicated on the lines, a common mode voltage (Vcm) of a differential signal present on the eUSB2 differential signal lines charges the center tap capacitance, causing Vcm to slowly rise. In some circumstances, such as when an eUSB2 repeater receives a start of packet (SOP) indicator according to eUSB2 signaling protocols, data bits of the SOP indicator present on the eUSB2 differential signal lines are unstable while the center tap capacitor is charging, potentially leading to inaccuracy (e.g., such as jitter) in detection and/or transmission of the SOP indicator by the eUSB2 repeater to a legacy USB system coupled to the eUSB2 repeater. The SOP indicator is, in some examples, referred to as a SYNC packet and comprises a clock signal, alternating between logical high and logical low values for a width of up to about 32 bits (e.g., a duration of about 32 unit intervals, where a unit interval is the period of time for transmitting 1 bit of data). Legacy USB and eUSB2 specifications, in some versions, permit truncation of up to 4 bits of the SOP indicator, corresponding to permitting truncation for a time period of 4 unit intervals (UI). However, in some examples, such as when the eUSB2 differential signal lines have a length greater than about ten inches, instability (e.g., such as oscillations and/or jitter) in the values present on the eUSB2 differential signal lines exceeds the permitted 4 UI (e.g., such as caused by increased capacitance present on the eUSB2 differential signal lines that have the length greater than about ten inches). This instability exceeding 4 UI, in some examples, prevents the eUSB2 repeater from accurately reproducing the SOP indicator and, in some examples, prevents a legacy USB system coupled to the eUSB2 repeater from accurately interpreting the SOP indicator and determining that a data packet is being received.

In some eUSB2 repeater implementations, a clock data recovery (CDR) circuit or a phase locked loop (PLL) determines clock timing information of a signal received by the eUSB2 repeater and, based on that clock timing information, the eUSB2 repeater reconstructs a received signal for subsequent transmission. This reconstruction according to a clock signal, in at least some examples, compensates for and/or corrects the above inaccuracies caused by the instability in the values present on the eUSB2 differential signal lines, causing the eUSB2 repeater to output an accurate SOP indicator. However, both a CDR circuit and a PLL are comparatively large components of an eUSB2 repeater in terms of footprint (e.g., physical surface area of a component die) with respect to a remainder of the eUSB2 repeater, increasing both cost to manufacture the eUSB2 repeater and power consumed by the eUSB2 repeater. In at least some aspects, goals of implementation of eUSB2 include providing communication according to the USB specifications in smaller, lower-power environments than legacy USB, which runs contrary to the size and power requirements of both the CDR circuit and the PLL. Accordingly, it at least some eUSB2 repeater implementations it is desirable to accurately detect and transmit an SOP indicator with truncation of less than 4 bits and/or for less than about 4 UI without using a CDR circuit or a PLL in either ingress or egress directions.

At least some aspects of the present disclosure provide for a circuit. The circuit is, in some examples, suitable for use in interfacing between eUSB2 and USB interfaces. Particularly, in at least some examples the circuit is an eUSB2 to USB repeater. In other examples, the circuit is a USB to eUSB2 repeater. For example, the circuit provides level-shifting from eUSB2 voltage levels to USB voltage levels and/or from USB voltage levels to eUSB2 voltage levels. As such, in at least some examples the circuit is viewed as a buffer and/or a level-shifter. In some examples, the circuit further provides support for one or more elements of USB communication, such as detection and transmission of an SOP indicator according to defined standard for USB and/or eUSB2 communication and/or protocols. For example, the circuit detects the beginning of an SOP indicator (or the beginning of receipt of any other data), such as by detecting that eUSB2 differential input signal lines of the circuit have transitioned from an idle state in which a differential voltage between the eUSB2 differential input signal lines of the circuit is less than a threshold amount to an active state in which the differential voltage between the eUSB2 differential input signal lines of the circuit is greater than the threshold amount. In response to detecting the beginning of the SOP indicator, in at least some examples, the circuit precharges Vcm to mitigate the effects of the center tap capacitance, such as the center tap capacitance causing Vcm to rise slowly in value and cause instability on the eUSB2 differential input signal lines.

The circuit precharges Vcm, in some examples, by providing a bias signal to a node at which Vcm is present and to which the center tap capacitor is coupled, responsive to detecting the beginning of the SOP indicator. In at least some examples, the bias signal is provided to the node by activating a switch in response to detecting the beginning of the SOP indicator, where activating the switch couples a bias voltage source to the node. The switch is activated, in some examples, for a period of about 2 UI, precharging the node for about 2 UI prior to the switch being disengaged and the precharging ending.

In other examples, the circuit precharges Vcm by precharging a first capacitor and, responsive to detecting the beginning of the SOP indicator, coupling the first capacitor to the node at which Vcm is present and to which a second capacitor is coupled, where the first capacitor and the second capacitor in combination form the center tap capacitance. The first capacitor, in some examples, has a capacitance much larger than the second capacitor such that the second capacitor charges comparatively rapidly (e.g., such as in comparison to a time that would be required to charge a capacitor having an amount of capacitance equal to that of the combination of the first capacitor and the second capacitor). For example, in some implementations the first capacitor has a capacitance of about 45 pF and the second capacitor has a capacitance of about 5 pF. In at least some examples, the circuit includes a bleeder sub circuit, where the bleeder sub circuit is configured to dampen (e.g., reduce and/or mitigate) oscillations in the circuit caused by coupling the first capacitor to the node at which Vcm is present and to which a second capacitor is coupled. In at least some examples, precharging Vcm prevents and/or mitigates instability in a signal present on the eUSB2 differential input signal lines resulting from charging of the center tap capacitance of the eUSB2 differential input signal lines, providing for accurate SOP indicator detection and transmission within truncation of 4 UI or less at a lower space and power cost than if the circuit implemented a CDR circuit and/or a PLL.

In yet other examples, the circuit includes an edge detector configured to detect a rising edge and/or a falling edge in a signal received by the circuit. Based on the detection, control of a transmitter (e.g., such as an amplifier having outputs coupled to output terminals of the circuit) is gated to prevent activation, or deactivation, of the transmitter when data is being received. Preventing the transmitter from activating and/or deactivating when data is being received, in some examples, prevents and or mitigates partial bit transmission by the circuit.

Turning now to FIG. 1, a block diagram of an illustrative system 100 is shown. In at least some examples, the system 100 is illustrative of a computing device, or elements of a computing device. For example, the system 100 includes a processor 105, an eUSB2 device 110, an eUSB2 repeater 115, and a USB device 120. The USB device 120 is a legacy USB device, as described elsewhere herein. In some examples, one or both of the eUSB2 device 110 or the USB device 120 is implemented external to the system 100 and configured to couple to the system 100 through an appropriate interface (e.g., such as a port and receptacle suitable for performing communication according to eUSB2 or USB protocol, respectively. The processor 105 is, in some examples, a SoC. The eUSB2 device 110 is any device operating in both ingress and egress communication directions according to signal voltage level specifications for eUSB2. The USB device 120 is any device operating in both ingress and egress communication directions according to signal voltage level specifications for legacy USB. For example, in at least some implementations the USB device 120 is a peripheral such as a user input device, (e.g., a sensor, a scanner, an imaging device, a microphone, etc.), an output device (e.g., a printer, speakers, etc.), a storage device, or any other peripheral, component, or device suitable for communicating with the processor 105.

The eUSB2 repeater 115 communicatively couples the processor 105 to the USB device 120 and vice versa, converting signals appropriate for the processor 105 to signals appropriate for the USB device 120 and vice versa. For example, in some implementations signaling in the processor 105 is performed in a range of about 0.8 V to about 1.4 V. Similarly, in some implementations signaling in the USB device 120 is performed at about 3.3 V or about 5 V. In at least some examples, the eUSB2 repeater 115 operates as a bit-level repeater, receiving signals from one of the processor 105 or USB device 120 and converting the signals for use by the other of the processor 105 or USB device 120 (e.g., by shifting a voltage level of the signals upward or downward based on a direction of the communications). In some examples, a data packet communicated in the system 100 begins with an SOP indicator, as discussed above.

In at least some examples, eUSB2 differential input signal lines of the eUSB2 repeater 115 transition from an idle state to an active state when the eUSB2 repeater 115 receives the SOP indicator via the eUSB2 differential input signal lines. In some examples, such as when the SOP indicator is received in communications originating at the processor 105, a center tap capacitor of the eUSB2 differential input signal lines begins charging when the eUSB2 differential input signal lines become active. However, during a period of time that the center tap capacitor is charging, in at least some examples, the eUSB2 differential input signal lines are unstable such that a value of a signal transmitted by the processor 105 is not accurately received by the eUSB2 repeater 115 (e.g., such as due to Vcm slowly increasing in value and not being stable). The instability, in some examples, causes more than 4 UI of the SOP indicator to be truncated.

Accordingly, in at least some examples the eUSB2 repeater 115 includes a precharge circuit 125 that precharges Vcm in response to detection of a start of communication on the eUSB2 differential input signal lines (e.g., such as a rising edge of the SOP indicator or any other data). The precharge circuit 125, in at least some examples, precharges the center tap capacitor to reduce a period of time in which the eUSB2 differential input signal lines are unstable to less than about 4 UI, less than about 2 UI, or less than about 1 UI. In at least some examples, the eUSB2 repeater 115 further includes an edge detector circuit 130 configured to detect a rising and/or falling edge of the SOP indicator and prevent activation and/or deactivation of a transmitter (not shown) of the eUSB2 repeater 115 while the SOP indicator is being received by the eUSB2 repeater 115.

Figure 2:
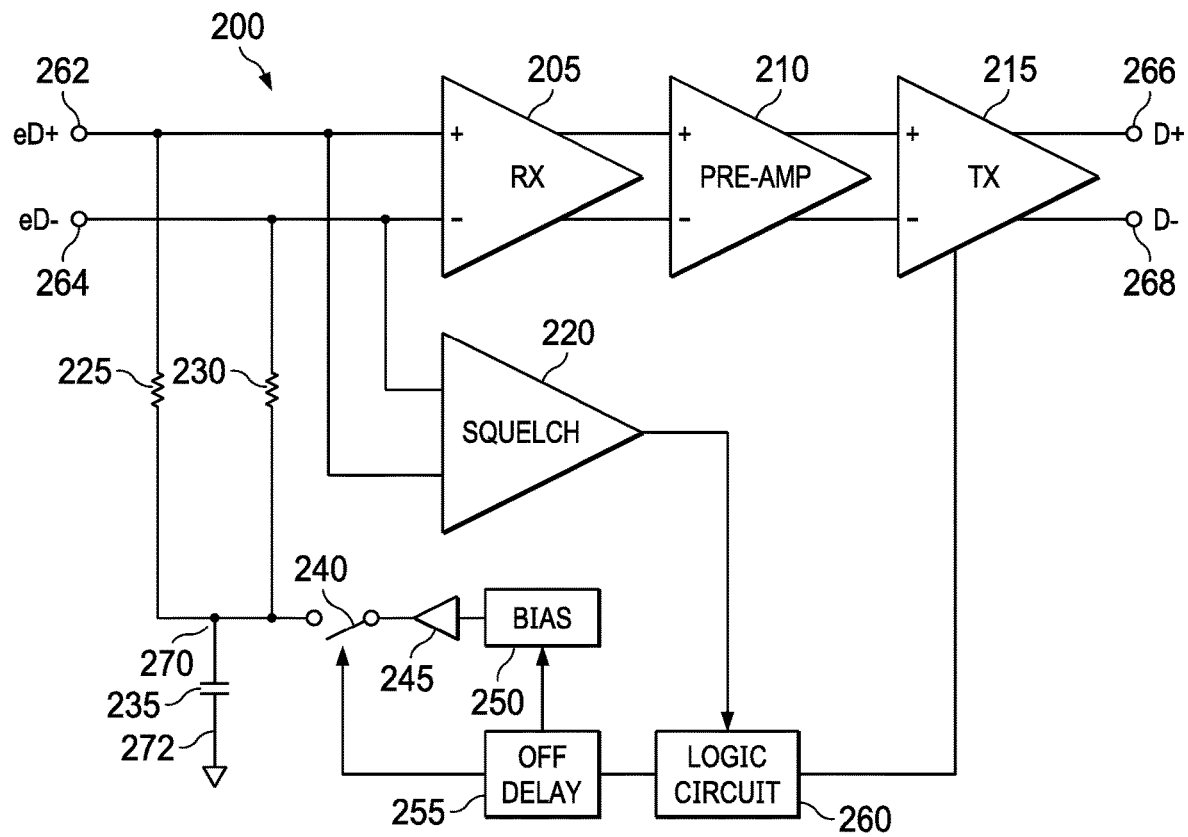
FIG. 2 shows a schematic diagram of an illustrative circuit in accordance with various examples.

Turning now to FIG. 2, a block diagram of an illustrative circuit 200 is shown. In at least some examples, the circuit 200 is suitable for implementation as the eUSB2 repeater 115 of the system 100 of FIG. 1. The circuit 200, in some examples, is representative of an eUSB2 repeater having functionality to receive data from an eUSB2 system and provide data to a legacy USB system. The circuit 200, in at least some examples, includes an amplifier 205, an amplifier 210, an amplifier 215, a squelch detector 220, a resistor 225, a resistor 230, a capacitor 235, a switch 240, a buffer 245, a bias voltage source 250, an off delay circuit 255 (e.g., such as a delay cell or any other suitable component for delaying appearance of a value in an output signal for some predetermined or configurable amount of time after receipt of the value in an input signal), and a logic circuit 260. In at least some examples, the amplifier 205 is considered a receiver (RX) of the circuit 200, the amplifier 210 is considered a pre-amplifier (Pre-Amp) of the circuit 200, and the amplifier 215 is considered a transmitter (TX) of the circuit 200. In at least some examples, the amplifier 210 is omitted from the circuit 200. In at least some examples, the circuit 200 expressly does not include a CDR circuit or a PLL.

In an example architecture of the circuit 200, the amplifier 205 has a positive differential input coupled to a node 262 and a negative differential input coupled to a node 264. The amplifier 210 has a positive differential input coupled to a negative differential output of the amplifier 205 and a negative differential input coupled to negative differential output of the amplifier 205. The amplifier 215 has a positive differential input coupled to a positive differential output of the amplifier 210, a negative differential input coupled to a negative differential output of the amplifier 210, a positive differential output coupled to a node 266, and a negative differential output coupled to a node 268, and a control terminal. The squelch detector 220 has a first input coupled to the node 262, a second input coupled to the node 264, and an output. The resistor 225 is coupled between the node 262 and a node 270. The resistor 230 is coupled between the node 264 and the node 270. The capacitor 235 is coupled between the node 270 and a ground terminal 272. A switch 245 has a first terminal coupled to the node 270, a second terminal coupled to an output of the buffer 245, and a control terminal coupled to an output of the off delay circuit 255. The buffer 245 has an input coupled to an output of the bias voltage source 250. The bias voltage source 250 has an input coupled to a second output of the off delay circuit 255. The logic circuit 260 has an input coupled to the output of the squelch detector 220, a first output coupled to an input of the off delay circuit 255, and a second output coupled to the control terminal of the amplifier 215.

The switch 240 is any component suitable for selectively electrically coupling two nodes together or selectively electrically decoupling the nodes, each based on a control signal received at the control terminal of the switch 240. For example, in various implementations suitable implementations for the switch 240 include a transistor or a relay. The buffer 245 is any component suitable to provide sufficient drive strength for driving the node 270 with a signal (and charging the capacitor 235) when the switch 240 is closed. The bias voltage source 250 is any component suitable for outputting a bias voltage selectively under control of the off delay circuit 255. The bias voltage is, in at least some examples, approximately equal to, or greater than, a Vcm specified according to eUSB2 protocol specifications (e.g., such as about 170 millivolts (mV)). The off delay circuit 255 is any circuit suitable for controlling the switch 240 to activate, coupling the output of the buffer 245 to the node 270, and controlling the switch 240 to deactivate, decoupling the output of the buffer 245 from the node 270, a predefined period of time later, such as about a period of 2 UI after controlling the switch 240 to activate. Additionally, in at least some examples the off delay circuit 255 controls the bias voltage source 250 to turn off after Vcm settles (e.g., such as about a period of 2 UI after controlling the switch 240 to activate) to minimize power consumption of the circuit 200 by preventing generation of the bias voltage when not needed in the circuit 200.

In an example of operation of the circuit 200, a differential input signal is received at the node 262 and the node 264. For example, a positive component of the differential input signal (eD+) is received at the node 262 and a negative component of the differential input signal (eD−) is received at the node 264. In this regard, in at least some examples the node 262 and the node 264 collectively comprise eUSB2 differential input ports and/or eUSB2 differential input signal lines of the circuit 200. The amplifier 205 amplifier 210, and amplifier 215 amplify the differential input signal received at the node 262 and the node 264 in a progressive, serial manner to provide a differential output signal at the node 266 and the node 268, respectively. A positive component of the differential output signal (D+) is output by the amplifier 215 at the node 266 and a negative component of the differential output signal (D−) is output by the amplifier 215 at the node 268. In this regard, in at least some examples the node 266 and the node 268 collectively comprise USB differential output ports and/or USB differential output signal lines of the circuit 200. In at least some examples, the amplifier 215 is powered by a different power source and/or receives a different supply voltage than the amplifier 205, for example, such that the circuit 200 uses a dual-supply to provide level-shifting functionality between the eUSB2 differential input ports and the USB differential output ports. Additionally, in at least some examples the amplifier 215 is subject to control of the logic circuit 260. For example, the logic circuit 260 controls when the amplifier 215 is active, amplifying signals output by the amplifier 210 to provide the differential output signal at the node 266 and the node 268, respectively, or when the amplifier 215 is turned off and is not amplifying signals output by the amplifier 210 to provide the differential output signal at the node 266 and the node 268, respectively.

The squelch detector 220, in at least some examples, outputs a logic high value signal when a differential between eD+ and eD− exceeds a threshold and outputs a logical low value signal when the differential between eD+ and eD− is less than the threshold. In this regard, in at least some implementations the squelch detector 220 operates to indicate whether the eUSB2 differential input signal lines are idle or active. For example, when the eUSB2 differential input signal lines are idle, the squelch detector 220 outputs a logical low signal and when the eUSB2 differential input signal lines are active, the squelch detector 220 outputs a logical high signal.

In at least some examples, both the resistor 225 and the resistor 230 have approximately a same resistance value such that they are balanced and a voltage present at the node 270 is approximately equal to common mode voltage (Vcm) of eD+ and eD−. Additionally, a center tap of eUSB2 differential signaling lines is floating, as discussed above, meaning the center tap is not referenced to a ground potential. Accordingly, in at least some examples the capacitor 235 has a capacitance of less than or equal to (e.g., up to about) 50 pF, as described by eUSB2 protocol specifications, to create the floating center tap between eD+ and eD−.

Figure 5:
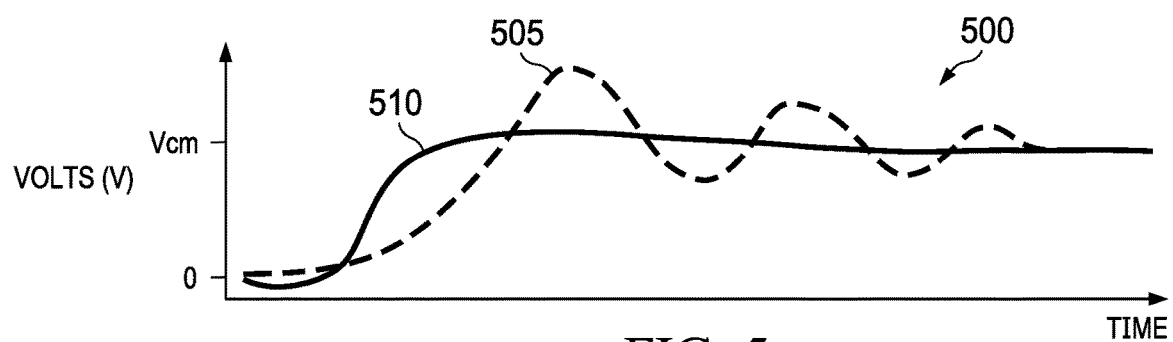
FIG. 5 shows a diagram of illustrative waveforms in accordance with various examples.

Turning now to FIG. 5, which illustrates a diagram 500 of illustrative waveforms, the waveform 505 illustrates when the eUSB2 differential input signal lines transition from an idle state to an active state (e.g., such as when a SOP indicator is received by the circuit 200 after the eUSB2 differential input signal lines have been in an idle state) and the switch 240 remains in an open or deactivated state, Vcm slowly increases in value. Additionally, Vcm includes ringing (e.g., oscillation) around approximately a value at which Vcm will ultimately settle after a period of time sufficient for the ringing to dissipate. The ringing is, in some examples, caused by a transmission line effect associated with the eUSB2 differential input signal lines. This slow rising and ringing in Vcm, in at least some examples, cause instability in the differential input signal (e.g., such as in the SOP indicator) and, in some examples, lasts for greater than 4 UI.

Returning now to FIG. 2, when the squelch detector 220 detects that data is being received via the eUSB2 differential input signal lines, based on an output signal of the squelch detector the logic circuit 260 controls the off delay circuit 255 to bias the capacitor 235 to mitigate the slow rise in value and ringing illustrated by waveform 505 of FIG. 5 and discussed above. To bias the capacitor 235, the off delay circuit 255 controls the bias voltage source 250 to output a bias voltage that is buffered by the buffer 245. The off delay circuit 255 further controls the switch 240 to activate, electrically coupling the output of the buffer 245 to the node 270 to charge the capacitor 235 based on the bias voltage signal. In at least some examples, the off delay circuit 255 controls the switch 240 to deactivate, electrically decoupling the output of the buffer 245 from the node 270, and controls the bias voltage source 250 to cease outputting the bias voltage after a predefined period of time. The predefined period of time is, in some examples, about 2 UI. Returning now to FIG. 5, as shown by the waveform 510, when the eUSB2 differential input signal lines transition from the idle state to the active and the switch 240 is closed or in an activated state, Vcm rapidly increases in value. Additionally, Vcm of the waveform 510 does not include the ringing shown in the waveform 505. This rapid rise in value and minimal ringing in Vcm, in at least some examples, prevents and/or minimizes the instability in the differential input signal such that the differential input signal is stable in less than, or equal to, 4 UI from when the eUSB2 differential input signal lines transitioned from the idle state to the active state.

Figure 3:
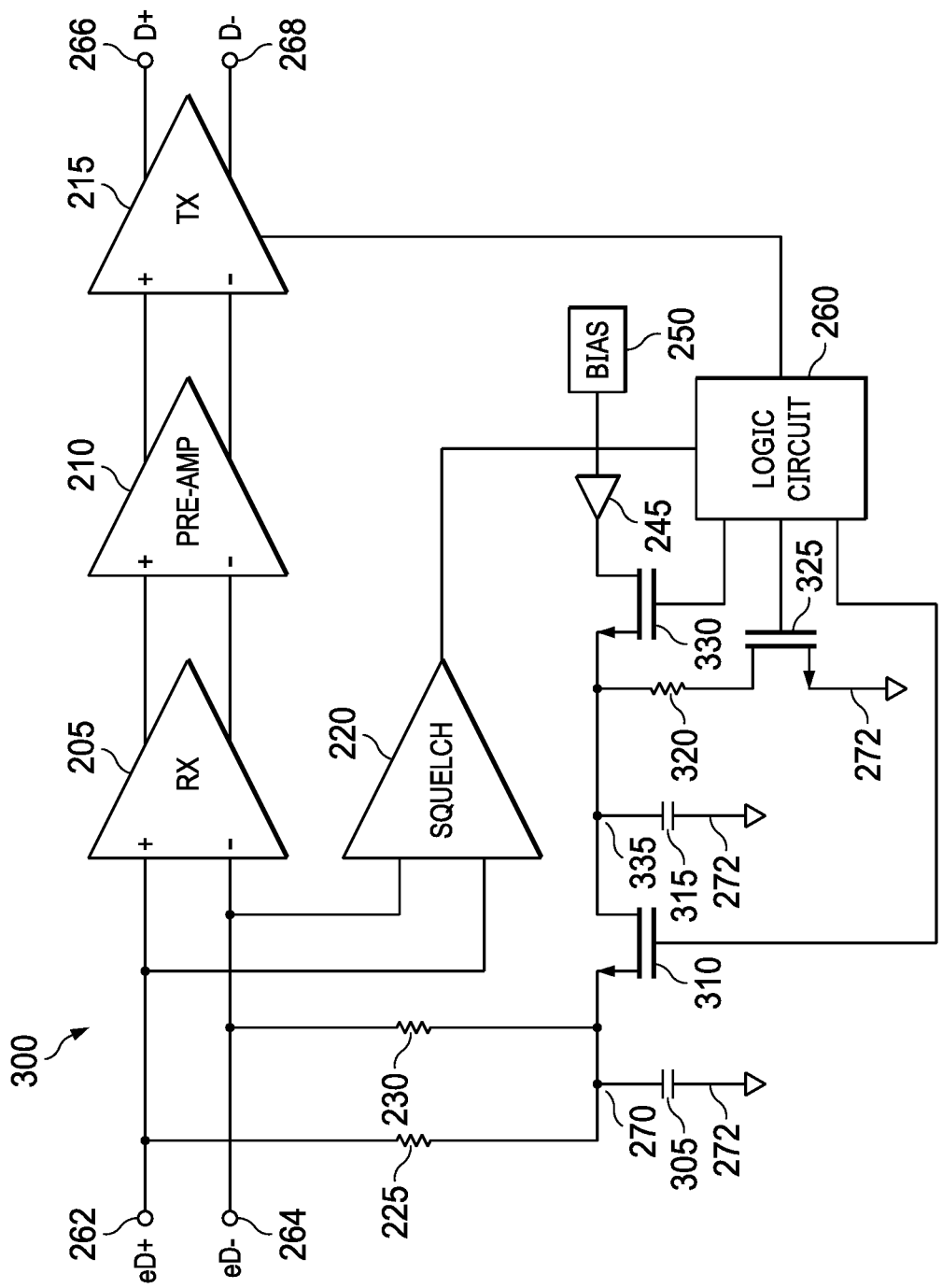
FIG. 3 shows a schematic diagram of an illustrative circuit in accordance with various examples.

Turning now to FIG. 3, a schematic diagram of an illustrative circuit 300 is shown. In at least some examples, the circuit 300 is suitable for implementation as the eUSB2 repeater 115 of the system 100 of FIG. 1. The circuit 300, in at least some examples, includes the amplifier 205, the amplifier 210, the amplifier 215, the squelch detector 220, the resistor 225, the resistor 230, the buffer 245, the bias voltage source 250, and the logic circuit 260. In at least some examples, the circuit 300 further includes a capacitor 305, a transistor 310, a capacitor 315, a resistor 320, a transistor 325, and a transistor 330. In at least some examples, the circuit 300 expressly does not include a CDR circuit or a PLL. The transistor 310, the transistor 325, and the transistor 330 are each, in some examples n-type field effect transistors (FETs).

In an example architecture of the circuit 300, components having like reference numerals to the circuit 200 of FIG. 2 are coupled as described above with respect to the circuit 200 and the description of which is not repeated herein. The capacitor 305 is coupled between the node 270 and the ground terminal 272. The transistor 310 has a source terminal coupled to the node 270, a drain terminal coupled to a node 335, and a gate terminal coupled to an output of the logic circuit 260. The capacitor 315 is coupled between the node 335 and the ground terminal 272. The resistor 320 is coupled between the node 335 and a drain terminal of the transistor 325, which has a source terminal coupled to the ground terminal 272 and a gate terminal coupled to another output of the logic circuit 260. The transistor 330 has a source terminal coupled to the node 335, a drain terminal coupled to an output of the buffer 245, and a gate terminal coupled to another output of the logic circuit 260. In at least some examples, the capacitor 305 has a capacitance of about 5 pF and the capacitor 315 has a capacitance of about 45 pF. In other examples, the capacitor 305 and the capacitor 315 each have any suitable capacitance such that, in parallel combination, their capacitance is less than or equal to about 50 pF and the capacitance of the capacitor 305 is less than the capacitance of the capacitor 315. The resistor 320, in at least some examples, has a resistance selected from a range of about 500 ohms to about 800 ohms.

In at least one example of operation, components of the circuit 300 having like reference numerals to those of the circuit 200 operate in substantially the same manner as discussed above with respect to the circuit 200. In at least some examples, when the eUSB2 differential input signal lines are in an idle state (e.g., when the squelch detector outputs a logical low value signal), the logic circuit controls the transistor 330 to turn on and conduct current, electrically coupling the output of the buffer 245 to the node 335 and providing the bias voltage to the node 335. When the transistor 330 is turned on and the bias voltage is provided to the node 335, the capacitor 315 charges. The transistor 330, in at least some examples, provides for synchronized charge transfer from the buffer 245 to the capacitor 315 to prevent contention between the bias voltage, as generated by the bias voltage source 250 and driven by the buffer 245, and Vcm. When the squelch detector 220 detects that the eUSB2 differential input signal lines are active and outputs a logic high value signal, the logic circuit 260 controls the transistor 330 to turn off, electrically decoupling the output of the buffer 245 from the node 335 and controls the transistor 310 to turn on and conduct current, electrically coupling the node 335 to the node 270. When the transistor 310 is turned on, the capacitor 315 at least partially discharges, rapidly charging the capacitor 305 and causing a value present at the node 270, and therefore Vcm, to be approximately equal to the bias voltage (e.g., such as equal to the bias voltage source minus a voltage drop associated with the transistor 310).

Figure 6:
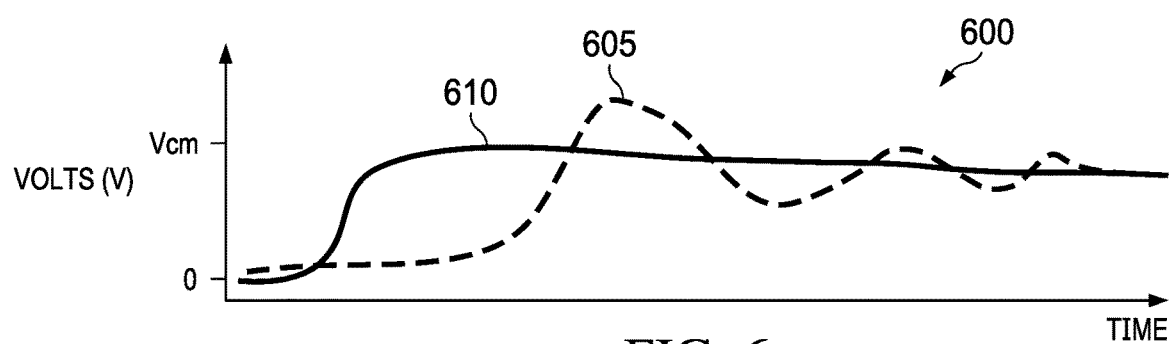
FIG. 6 shows a diagram of illustrative waveforms in accordance with various examples.

Turning to FIG. 6, a diagram 600 of illustrative waveforms is shown. The waveform 605 illustrates when the eUSB2 differential input signal lines transition from an idle state to an active state and the transistor 310 remains turned off, Vcm slowly increases in value. Additionally, Vcm includes ringing (e.g., oscillation) around approximately a value at which Vcm will ultimately settle after a period of time sufficient for the ringing to dissipate. The ringing is, in some examples, caused by a transmission line effect associated with the eUSB2 differential input signal lines. This slow rising and ringing in Vcm, in at least some examples, cause instability in the differential input signal (e.g., such as in the SOP indicator) and, in some examples, lasts for greater than 4 UI. As shown by waveform 610, when the eUSB2 differential input signal lines transition from the idle state to the active and the transistor 310 is turned on, Vcm rapidly increases in value. Additionally, Vcm of the waveform 610 does not include the ringing shown in the waveform 605. This rapid rise in value and minimal ringing in Vcm, in at least some examples, prevents and/or minimizes the instability in the differential input signal such that the differential input signal is stable in less than, or equal to, 4 UI from when the eUSB2 differential input signal lines transitioned from the idle state to the active state.

Figure 7:
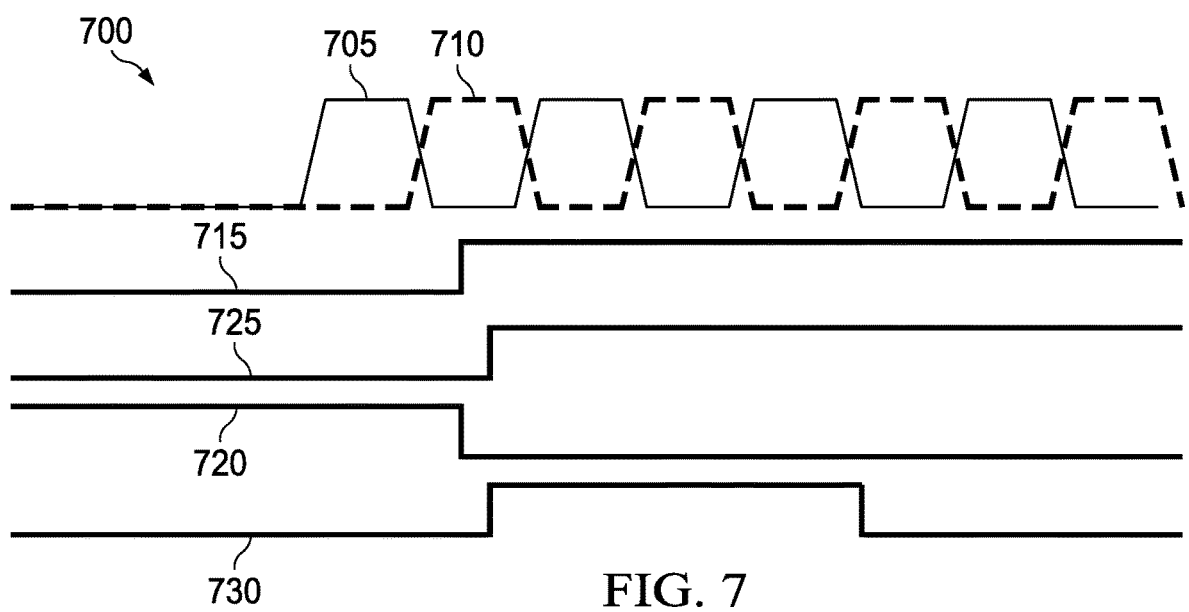
FIG. 7 shows a diagram of illustrative waveforms in accordance with various examples.

Returning now to FIG. 3, in at least some examples, when the node 335 is coupled to the node 270, Vcm experiences ringing as a result of the sudden increase in capacitance present at the node 270 and/or as a result of transmission line effects of the eUSB2 differential input signal lines. To compensate for and dampen the ringing, the resistor 320 and the transistor 325 together form a bleeder sub circuit. In at least some examples, after controlling the transistor 310 to turn on, the logic circuit 260 controls the transistor 325 to turn on and conduct current, bleeding current from the node 335, and thereby the node 270, damping effects of the ringing present in Vcm. In some examples, the logic circuit 260 maintains the transistor 325 turned on for a predefined period of time to dampen the ringing before controlling the transistor 325 to turn off while the transistor 310 remains on. In at least some examples, the predefined period of time is in a range of about 6 to about 10 nanoseconds (ns). Turning to FIG. 7, a timing diagram 700 illustrates illustrative control signals. In at least some examples, a signal 705 corresponds to eD+, a signal 710 corresponds to eD−, a signal 715 corresponds to an output of the squelch detector 220 provided to the logic circuit 260, a signal 720 corresponds to a control signal output by the logic circuit 260 to control the transistor 330, a signal 725 corresponds to a control signal output by the logic circuit 260 to control the transistor 310, and a signal 730 corresponds to a control signal output by the logic circuit 260 to control the transistor 325, each as discussed above.

Returning now to FIG. 3, in at least some examples, the logic circuit 260 is further configured to receive an end of packet (EOP) detection signal. When the EOP detection signal indicates that an EOP indicator has been received at the eUSB2 differential input signal lines, the logic circuit 260 controls the transistor 310 to turn off, electrically decoupling the node 270 from the node 335. In at least some examples, the logic circuit 260 then controls the transistor 330 to again turn on, recharging the capacitor 315. In some examples, the logic circuit 260 uses the output signal of the squelch detector 220 as a condition for controlling the transistor 310 to turn off. For example, when the output signal of the squelch detector 220 returns to the logical low value from the logical high value, the eUSB2 differential input signal lines have returned from the active state to the idle state and, responsive to the output signal of the squelch detector 220 transitioning to the logical low value, the logic circuit 260 controls the transistor 310 to turn off and, in some examples, controls the transistor 330 to again turn on, recharging the capacitor 315. In some examples, the resistor 320, the transistor 325, and the transistor 330 are omitted. In such examples, the node 335 would be coupled to the output of the buffer 245 and the bias voltage source 250 would have an input terminal coupled to, and subject to control by, the logic circuit 260.

Figure 4:
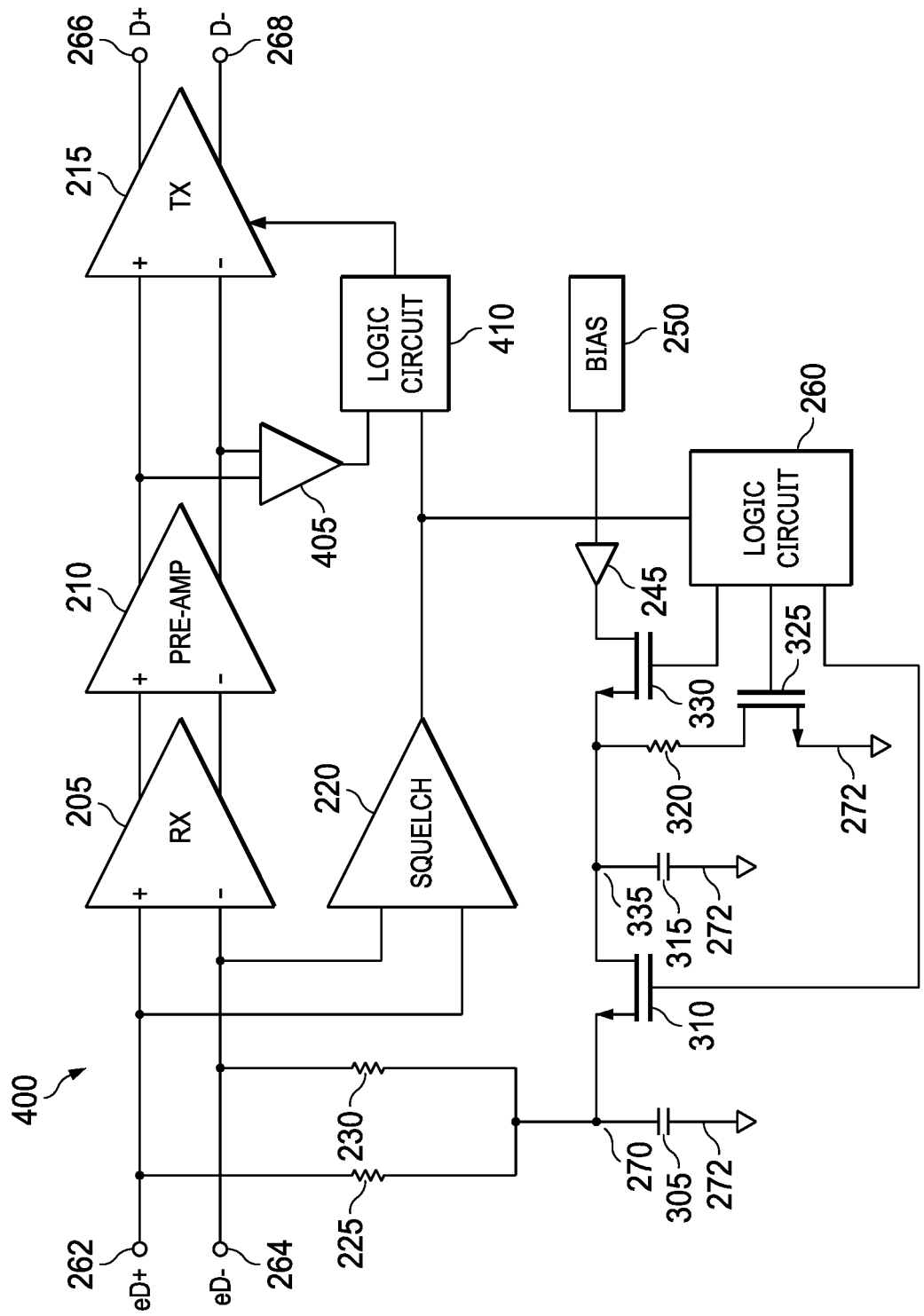
FIG. 4 shows a schematic diagram of an illustrative circuit in accordance with various examples.

Turning now to FIG. 4, a schematic diagram of an illustrative circuit 400 is shown. In at least some examples, the circuit 400 is suitable for implementation as the eUSB2 repeater 115 of the system 100 of FIG. 1. The circuit 400, in at least some examples, includes the amplifier 205, the amplifier 210, the amplifier 215, the squelch detector 220, the resistor 225, the resistor 230, the buffer 245, the bias voltage source 250, the logic circuit 260, the capacitor 305, the transistor 310, the capacitor 315, the resistor 320, the transistor 325, and the transistor 330. In at least some examples, the circuit 400 further includes an edge detector 405 and a logic circuit 410. In at least some examples, the circuit 300 expressly does not include a CDR circuit or a PLL.

In an example architecture of the circuit 400, components having like reference numerals to the circuit 200 of FIG. 2 and/or circuit 300 of FIG. 3 are coupled as described above with respect to the circuit 200 and/or the circuit 300 and the description of which is not repeated herein. A first input of the edge detector 405 is coupled to the first input of the amplifier 215, a second input of the edge detector 405 is coupled to the second input of the amplifier 215, and an output of the edge detector 405 is coupled to a first input of the logic circuit 410. A second input of the logic circuit 410 is coupled to the output of the squelch detector 220 and an output of the logic circuit 410 is coupled to the control terminal of the amplifier 215.

In at least one example of operation, components of the circuit 400 having like reference numerals to those of the circuit 200 and/or the circuit 300 operate in substantially the same manner as discussed above with respect to the circuit 200 and/or the circuit 300. In at least some examples, the logic circuit 410 is any analog or digital component or combination of components suitable for, and configured to, perform logical operations to determine a control signal for controlling activation or deactivation of the amplifier 215. For example, to prevent partial bit transmission by the circuit 400 (e.g., activation of the amplifier 215 at a time other than an edge transition of a differential signal received by the amplifier 215, the logic circuit 410 compares the output of the edge detector 405 with the output signal of the squelch detector 220. Based on a result of that comparison, the logic circuit 410 generates a control signal for controlling the amplifier 215 to activate or deactivate (e.g., at an edge transition of a differential signal received by the amplifier 215) or not activate or deactivate (e.g., when not at an edge transition of the differential signal received by the amplifier 215). In at least some examples, the logic circuit 410 is said to gate the output of the amplifier 405 using the output signal of the squelch detector 220.

Figure 8:
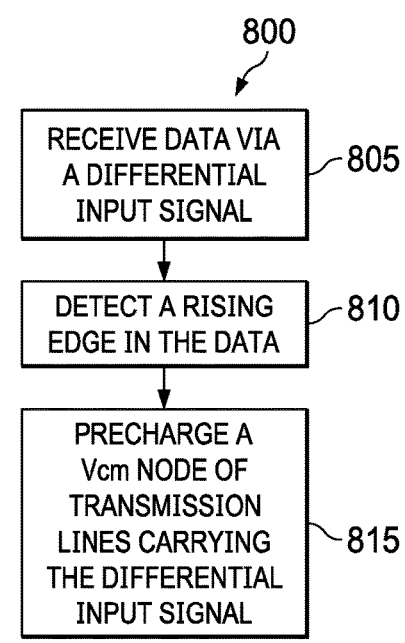
FIG. 8 shows a flowchart of an illustrative method in accordance with various examples.

Turning now to FIG. 8, a flowchart of an illustrative method 800 is shown. In at least some examples, the method 800 corresponds to actions performed by one or more components of the system 100, the circuit 200, the circuit 300, and/or the circuit 400. The method 800 is, in some examples, a method for controlling a circuit, such as an eUSB2 repeater. Implementation of the method 800 by a circuit, in at least some examples, is advantageous in preventing instability in eUSB2 differential input signal lines (and/or values present on the eUSB2 differential input signal lines) without the use of a CDR circuit or PLL.

At operation 805, data is received via a differential input signal. In some examples, such as when the differential signal is received according to eUSB2 signaling protocols, a center tap of the differential input signal is floating. When data is being received via the differential input signal, the differential input signal is considered to be active. In at least some examples, the differential signal transitions from an idle state to the active state at operation 805.

At operation 810, a rising edge in the data is detected. In at least some examples, the detection is performed by a squelch detector. The squelch detector detects a difference between a positive component of the differential input signal and a negative component of the differential input signal and, when the difference exceeds a threshold, outputs a logical high signal to indicate that transmission lines carrying the differential input signal are active and the differential input signal includes data.

At operation 815, a Vcm node of the transmission lines carrying the differential input signal lines is precharged. The precharging is performed, in some examples, by coupling a bias voltage source to the Vcm node when the rising edge in the data is detected by the squelch detector. In other examples, the precharging is performed by coupling a charged first capacitor in parallel with an uncharged second capacitor when the rising edge in the data is detected by the squelch detector, where top plates of both the first capacitor and the second capacitor are electrically coupled to the Vcm node.

For example, in some implementations of the operation 815, precharging the Vcm node includes controlling a switch to close for a predetermined period of time (e.g., such as about 4 UI, as discussed above) beginning approximately when the rising edge in the data is detected by the squelch detector and controlling the switch to open at an expiration of the predetermined period of time. In other implementations of the operation 815, precharging the Vcm node incudes controlling a first switch (e.g., such as a transistor) to close to charge a first capacitor, controlling the first switch to open, controlling a second switch (e.g., such as a transistor) to close approximately when the rising edge in the data is detected by the squelch detector to charge a second capacitor based on the stored charge of the first capacitor, where top plates of both the first capacitor and the second capacitor are electrically coupled to the Vcm node, and controlling the second switch to close when an end of receipt of the data is detected. In some examples, precharging the Vcm node further includes controlling a third switch (e.g., such as a transistor) to close to dampen oscillations present at the Vcm node and controlling the third switch to close after a predetermined period of time. In some examples, precharging the Vcm node further includes controlling the first switch to again close to recharge the first capacitor and controlling the first switch to open after the first capacitor is recharged.

While the operations of the method 800 have been discussed and labeled with numerical reference, in various examples the method 800 includes additional operations that are not recited herein (e.g., such as intermediary comparisons, logical operations, output selections such as via a multiplexer, etc.), in some examples any one or more of the operations recited herein include one or more sub-operations (e.g., such as intermediary comparisons, logical operations, output selections such as via a multiplexer, etc.), in some examples any one or more of the operations recited herein is omitted, and/or in some examples any one or more of the operations recited herein is performed in an order other than that presented herein (e.g., in a reverse order, substantially simultaneously, overlapping, etc.), all of which is intended to fall within the scope of the present disclosure.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, drain-extended, natural, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a first amplifier having a first input coupled to a first node, a second input coupled to a second node, a first output, and a second output;
   a second amplifier having a first input coupled to the first output of the first amplifier, a second input coupled to the second output of the first amplifier, a first output, and a second output;
   a third amplifier having a first input coupled to the first output of the second amplifier, a second input coupled to the second output of the second amplifier, a first output coupled to a third node, and a second output coupled to a fourth node;
   a squelch detector having a first input coupled to the first node, a second input coupled to the second node, and an output;
   a first resistor coupled between the first node and a fifth node;
   a second resistor coupled between the fifth node and the second node;
   a first capacitor coupled between the fifth node and a ground terminal;
   a first transistor having a source terminal coupled to the fifth node, a drain terminal coupled to a sixth node, and a gate terminal, wherein the sixth node is configured to receive a bias voltage signal; and
   a logic circuit having an input coupled to the output of the squelch detector and an output coupled to the gate terminal of the first transistor;
   wherein the first node is configured to receive a positive component of a differential input signal (eD+) from an embedded Universal Serial Bus (USB) (eUSB) system, wherein the second node is configured to receive a negative component of the differential input signal (eD−) from the eUSB system, wherein the third node is configured to output a positive component of a differential output signal (D+) to a legacy USB system, and wherein the fourth node is configured to output a negative component of the differential output signal (D−) to the legacy USB system.

2. The circuit of claim 1, further comprising a second transistor having a source terminal coupled to the sixth node, a drain terminal configured to receive the bias voltage signal, and a gate terminal coupled to a second output of the logic circuit.

3. The circuit of claim 2, further comprising a buffer having an output coupled to the drain terminal of the second transistor and an input configured to couple to a bias voltage source to receive the bias voltage signal from the bias voltage source.

4. The circuit of claim 1, further comprising:
a third transistor having a drain terminal, a source terminal coupled to the ground terminal, and a gate terminal coupled to a third output of the logic circuit; and
a third resistor coupled between the sixth node and the drain terminal of the third transistor.

5. The circuit of claim 1, further comprising a second capacitor coupled between the sixth node and the ground terminal.

6. The circuit of claim 1, further comprising:
an edge detector having a first input coupled to the first input of the third amplifier, a second input coupled to the second input of the third amplifier and an output; and
a second logic circuit having a first input coupled to the output of the edge detector, a second input coupled to the output of the squelch detector, and an output coupled to a control terminal of the third amplifier.

7. A circuit, comprising:
a squelch detector having a first input coupled to a first node, a second input coupled to a second node, and an output, wherein the first node is configured to receive a positive component of a differential input signal with a floating center tap, and wherein the second node is configured to receive a negative component of the differential input signal with the floating center tap;
a first resistor coupled between the first node and a third node;
a second resistor coupled between the third node and the second node;
a first capacitor coupled between the third node and a ground terminal;
a first transistor having a source terminal coupled to the third node, a drain terminal coupled to a fourth node, and a gate terminal;
a second capacitor coupled between the fourth node and the ground terminal;
a second transistor having a source terminal coupled to the sixth node, a drain terminal configured to receive a bias voltage signal, and a gate terminal; and
a logic circuit having an input coupled to the output of the squelch detector, a first output coupled to the gate terminal of the first transistor, and a second output coupled to the gate terminal of the second transistor;
wherein the logic circuit is configured to:
receive an output signal from the squelch detector indicating a beginning of data transmission in the differential input signal; and
control the first transistor to turn on and conduct current, electrically coupling the fourth node to the third node to charge the first capacitor at least partially according to energy stored by the second capacitor and bias the third node according to the energy stored by the second capacitor, wherein the energy stored by the second capacitor is based at least partially on the bias voltage signal;
wherein the logic circuit is further configured to control a third transistor to turn on and conduct current to dampen oscillations in a signal present at the third node, wherein the third transistor is a component of a bleeder sub circuit, and wherein the logic circuit controls the third transistor to turn off after a second predefined period of time.

8. A circuit, comprising:
a squelch detector having a first input coupled to a first node, a second input coupled to a second node, and an output, wherein the first node is configured to receive a positive component of a differential input signal with a floating center tap, and wherein the second node is configured to receive a negative component of the differential input signal with the floating center tap;
a first resistor coupled between the first node and a third node;
a second resistor coupled between the third node and the second node;
a first capacitor coupled between the third node and a ground terminal;
a first transistor having a source terminal coupled to the third node, a drain terminal coupled to a fourth node, and a gate terminal;
a second capacitor coupled between the fourth node and the ground terminal;
a second transistor having a source terminal coupled to the sixth node, a drain terminal configured to receive a bias voltage signal, and a gate terminal; and
a logic circuit having an input coupled to the output of the squelch detector, a first output coupled to the gate terminal of the first transistor, and a second output coupled to the gate terminal of the second transistor;
wherein the logic circuit is configured to:
receive an output signal from the squelch detector indicating a beginning of data transmission in the differential input signal; and
control the first transistor to turn on and conduct current, electrically coupling the fourth node to the third node to charge the first capacitor at least partially according to energy stored by the second capacitor and bias the third node according to the energy stored by the second capacitor, wherein the energy stored by the second capacitor is based at least partially on the bias voltage signal;
wherein the logic circuit is further configured to:
receive an end of packet (EOP) detection signal indicating an end of the data transmission in the differential input signal; and
control the first transistor to turn off and stop conducting current in response to receipt of the EOP detection signal.

9. A circuit, comprising:
a squelch detector having a first input coupled to a first node, a second input coupled to a second node, and an output, wherein the first node is configured to receive a positive component of a differential input signal with a floating center tap, and wherein the second node is configured to receive a negative component of the differential input signal with the floating center tap;
a first resistor coupled between the first node and a third node;
a second resistor coupled between the third node and the second node;
a first capacitor coupled between the third node and a ground terminal;
a first transistor having a source terminal coupled to the third node, a drain terminal coupled to a fourth node, and a gate terminal;
a second capacitor coupled between the fourth node and the ground terminal;

a second transistor having a source terminal coupled to the sixth node, a drain terminal configured to receive a bias voltage signal, and a gate terminal; and a logic circuit having an input coupled to the output of the squelch detector, a first output coupled to the gate terminal of the first transistor, and a second output coupled to the gate terminal of the second transistor;

wherein the logic circuit is configured to:

receive an output signal from the squelch detector indicating a beginning of data transmission in the differential input signal; and control the first transistor to turn on and conduct current, electrically coupling the fourth node to the third node to charge the first capacitor at least partially according to energy stored by the second capacitor and bias the third node according to the energy stored by the second capacitor, wherein the energy stored by the second capacitor is based at least partially on the bias voltage signal;

wherein the logic circuit is further configured to:

control the second transistor to turn on and conduct current to charge the second capacitor based at least partially on the bias voltage signal after controlling the first transistor to turn off; and control the second transistor to turn off after a predefined period of time.

\* \* \* \* \*